United States Patent
Sawaki et al.

(10) Patent No.: US 10,388,851 B2
(45) Date of Patent: Aug. 20, 2019

(54) PIEZOELECTRIC ELEMENT

(71) Applicant: FUJIFILM Corporation, Tokyo (JP)

(72) Inventors: Daigo Sawaki, Kanagawa (JP); Takami Arakawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/040,237

(22) Filed: Jul. 19, 2018

(65) Prior Publication Data

US 2018/0351075 A1 Dec. 6, 2018

Related U.S. Application Data

(63) Continuation of application No. PCT/JP2017/002983, filed on Jan. 27, 2017.

(30) Foreign Application Priority Data

Feb. 5, 2016 (JP) .................. 2016-020411

(51) Int. Cl.
*H01L 41/18* (2006.01)
*H01L 41/187* (2006.01)
(Continued)

(52) U.S. Cl.
CPC ...... *H01L 41/1876* (2013.01); *C23C 14/0068* (2013.01); *C23C 14/08* (2013.01);
(Continued)

(58) Field of Classification Search
CPC ............. H01L 41/1876; H01L 41/0805; H01L 41/09; C23C 14/08; C23C 14/088; C23C 14/0068
See application file for complete search history.

(56) References Cited

U.S. PATENT DOCUMENTS 5,625,529 A * 4/1997 Lee .................. H01L 21/02197
257/295
7,037,731 B2 * 5/2006 Kijima .................. C01G 33/006
257/E21.272
(Continued)

FOREIGN PATENT DOCUMENTS

JP 2006-278489 A 10/2006
JP 2010-182717 A 8/2010
(Continued)

OTHER PUBLICATIONS

J. Castro, T. de los Rios & L. Fuentes (2000) Synthesis and Characterization of Nb-Doped PZT Ferro-Piezoelectric Ceramics, Materials and Manufacturing Processes, 15:2, 301-310, DOI: 10.1080/10426910008912989 (Year: 2000).*
(Continued)

*Primary Examiner* — J. San Martin
(74) *Attorney, Agent, or Firm* — Studebaker & Brackett PC

(57) ABSTRACT

A piezoelectric element includes a substrate, and a lower electrode, a piezoelectric film, an adhesion layer, and an upper electrode provided on the substrate in this order, in which the piezoelectric film has a perovskite structure that is preferentially oriented to a (100) plane and is a composite oxide represented by the compositional formula $Pb[(Zr_xTi_{1-x})_{1-y}Nb_y]O_3$, where x satisfies $0<x<1$ and y satisfies $0.10 \le y < 0.13$, $I_{(200)}/I_{(100)}$, which is a ratio between a diffraction peak intensity $I_{(100)}$ from the perovskite plane and a diffraction peak intensity $I_{(200)}$ from a perovskite plane as measured by X-ray diffraction method, satisfies $0.85 \le I_{(200)}/I_{(100)} \le 1.00$, and the adhesion layer contains a metal having an ionization energy of 0.34 eV or less.

3 Claims, 2 Drawing Sheets

(51) Int. Cl.
  *C23C 14/08* (2006.01)
  *H01L 41/09* (2006.01)
  *H01L 41/316* (2013.01)
  *H01L 41/08* (2006.01)
  *C23C 14/00* (2006.01)

(52) U.S. Cl.
  CPC ........ *C23C 14/088* (2013.01); *H01L 41/0805* (2013.01); *H01L 41/09* (2013.01); *H01L 41/187* (2013.01); *H01L 41/316* (2013.01)

(56) References Cited

U.S. PATENT DOCUMENTS

| | | |
|---|---|---|
| 2006/0256165 A1 | 11/2006 | Takabe et al. |
| 2011/0316393 A1 | 12/2011 | Naono et al. |
| 2014/0159549 A1* | 6/2014 | Kubo ................. H01L 41/0478 310/363 |
| 2016/0020381 A1* | 1/2016 | Arakawa ............... C04B 35/499 428/220 |
| 2016/0254439 A1* | 9/2016 | Potrepka ............... C23C 14/088 204/192.18 |
| 2017/0050439 A1* | 2/2017 | Mawatari .................. B41J 2/14 |
| 2017/0199375 A1* | 7/2017 | Naono ................... G02B 26/08 |
| 2017/0256700 A1* | 9/2017 | Murakami ............ C04B 35/493 |
| 2017/0352796 A1* | 12/2017 | Naono ................... H01L 41/09 |
| 2018/0254406 A1* | 9/2018 | Murakami ................. B41J 2/14 |

FOREIGN PATENT DOCUMENTS

| | | |
|---|---|---|
| JP | 2011-181720 A | 9/2011 |
| JP | 2012-009677 A | 1/2012 |
| JP | 2013-168530 A | 8/2013 |
| JP | 2014-203840 A | 10/2014 |

OTHER PUBLICATIONS

An Office Action mailed by the German Patent and Trademark Office dated Nov. 5, 2018, which corresponds to German Patent Application No. 112017000678.3 and is related to U.S. Appl. No. 16/040,237.

International Search Report issued in PCT/JP2017/002983; dated May 9, 2017.

Written Opinion issued in PCT/JP2017/002983; dated May 9, 2017.

International Preliminary Report on Patentability issued in PCT/JP2017/002983; completed Oct. 30, 2017.

* cited by examiner

PIEZOELECTRIC ELEMENT

CROSS-REFERENCE TO RELATED APPLICATIONS

This application is a continuation application of International Application No. PCT/JP2017/002983 filed Jan. 27, 2017, which was published under PCT Article 21(2) in Japanese, and which claims priority under 35 U.S.C. § 119(a) to Japanese Patent Application No. 2016-020411, filed Feb. 5, 2016. The above applications are hereby expressly incorporated by reference, in their entirety, into the present application.

BACKGROUND OF THE INVENTION

1. Field of the Invention

The present invention relates to a piezoelectric element provided with a lead zirconate titanate-based piezoelectric film.

2. Description of the Related Art

A piezoelectric element including a piezoelectric film that expands or contracts according to an increase or decrease in intensity of an applied electric field and a pair of electrodes that apply an electric field to the piezoelectric film (upper electrode and lower electrode) is used as a piezoelectric actuator or the like to be mounted on an ink jet recording head. In a case where a piezoelectric element is used in an ink jet recording head or the like, an element having a high piezoelectric constant is required to achieve high speed and higher definition. In addition, since a low frequency of replacement of an ink jet head is preferable, sufficient durability in practical use is required.

As piezoelectric materials for a piezoelectric film, lead zirconate titanate (hereinafter, also referred to as PZT), and a substitution system of PZT in which at least one of an A site or B site of PZT is substituted by another element has been known. It is known that in PZT to which a donor ion having a valence higher than the valence of a substitutable ion is added, piezoelectric performance is further improved than that of PZT. As a donor ion that substitutes for an element on the B site, $V^{5+}$, $Nb^{5+}$, $Ta^{5+}$, $Sb^{5+}$, $Mo^{6+}$, $W^{6+}$, or the like are known.

For example, JP2012-9677A discloses a piezoelectric element in which the amount of Nb in a piezoelectric body is 13% or more, and a ratio $I_{(200)}/I_{(100)}$ between a peak intensity $I_{(200)}$ of a (200) plane and a peak intensity $I_{(100)}$ of a (100) plane as measured by X-ray diffraction (XRD) method satisfies $I_{(200)}/I_{(100)} \leq 0.8$. According to this piezoelectric element, since the content of unstable Pb ions in the crystal is reduced, continuous driving durability can be improved and good piezoelectric characteristics can be maintained.

In addition, JP2010-182717A discloses a piezoelectric body in which a signal ratio between $Pb^{4+}$ and $Pb^{2+}$ is defined by X-ray absorption fine structure analysis in a perovskite type oxide. According to this piezoelectric body, it is possible to obtain good piezoelectric characteristics and durability.

SUMMARY OF THE INVENTION

In an upper electrode of a piezoelectric element, highly stable Ir or Pt and the like are used. However, the use of such materials causes poor adhesiveness between a piezoelectric film and the upper electrode, resulting in peeling-off of the upper electrode. Thus, an adhesion layer is arranged between the piezoelectric film and the upper electrode. For the adhesion layer, an easily oxidizable material is used. From research results of the present inventors, a new problem has been found that a leakage current increases in the piezoelectric element formed by using the piezoelectric body in which the peak intensity ratio satisfies $I_{(200)}/I_{(100)} \leq 0.8$ as disclosed in JP2012-9677A, in a case where a heat treatment such as a solder reflow step or the like is performed.

The present invention is made in consideration of the above circumstances and an object thereof is to provide a piezoelectric element capable of maintaining good piezoelectric characteristics and suppressing a leakage current.

As a result of intensive investigations conducted by the present inventors, it has been found that in a piezoelectric element having an adhesion layer, which is subjected to a heat treatment, by setting a content of Nb and $I_{(200)}/I_{(100)}$, which is a ratio between a diffraction peak intensity $I_{(100)}$ from a perovskite (100) plane and a diffraction peak intensity $I_{(200)}$ from a perovskite (200) plane as measured by an X-ray diffraction method, to specific values, good piezoelectric characteristics can be maintained and a leakage current can be suppressed, and thus the present invention has been completed.

That is, according to the present invention, there is provided a piezoelectric element comprising: a substrate; a lower electrode; a piezoelectric film; an adhesion layer; and an upper electrode, in which the lower electrode, the piezoelectric film, the adhesion layer, and the upper electrode are provided on the substrate in this order, the piezoelectric film has a perovskite structure that is preferentially oriented to a (100) plane and is a composite oxide represented by a compositional formula $Pb[(Zr_x Ti_{1-x})_{1-y}Nb_y]O_3$, where x satisfies $0<x<1$ and y satisfies $0.10 \leq y \leq 0.13$, $I_{(200)}/I_{(100)}$, which is a ratio between a diffraction peak intensity $I_{(100)}$ from the perovskite (100) plane and a diffraction peak intensity $I_{(200)}$ from a perovskite (200) plane as measured by X-ray diffraction method, satisfies $0.85 \leq I_{(200)}/I_{(100)} \leq 1.00$, and the adhesion layer contains a metal having an ionization energy of 0.34 eV or less.

It is preferable that $I_{(200)}/I_{(100)}$ satisfies $0.90 \leq I_{(200)}/I_{(100)} \leq 1.00$.

It is preferable that a film thickness of the piezoelectric film is 2.0 μm or more.

According to the piezoelectric element of the present invention, it is possible to provide a piezoelectric element capable of maintaining good piezoelectric characteristics and suppressing a leakage current.

DESCRIPTION OF THE PREFERRED EMBODIMENTS

[Piezoelectric Element]

Figure 1:
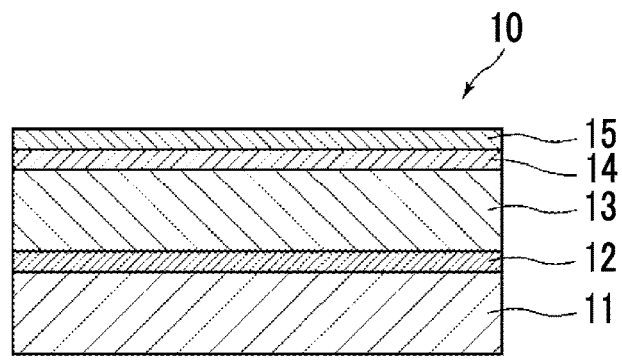
FIG. 1 is a schematic cross-sectional view showing an embodiment of a piezoelectric element of the present invention.

A piezoelectric element of the present invention will be described with reference to FIG. 1. FIG. 1 is a schematic cross-sectional view showing an embodiment of a piezoelectric element of the present invention.

A piezoelectric element 10 includes a lower electrode 12, a piezoelectric film 13, an adhesion layer 14, and an upper electrode 15 on a surface of a substrate 11. The piezoelectric film 13 is formed such that an electric field is applied by the lower electrode 12 and the upper electrode 15 in a film thickness direction.

The substrate 11 is not particularly limited and substrates of silicon, glass, stainless steel (for example, SUS304), yttrium stabilized zirconia (YSZ), $SrTiO_3$, alumina, sapphire, and silicon carbide may be used. As the substrate, a laminated substrate such as a silicon on insulator (SOI) substrate in which a $SiO_2$ film and a Si active layer are sequentially laminated on a silicon substrate may be used. In addition, a buffer layer for improving lattice matching properties, an adhesion layer for improving adhesiveness between the electrode and the substrate, or the like may be provided between the substrate and the lower electrode.

The lower electrode 12 is an electrode for applying a voltage to the piezoelectric film 13. The lower electrode is not particularly limited and is formed of metals such as Au, Pt, Ir, $IrO_2$, $RuO_2$, $LaNiO_3$, $SrRuO_3$, ITO, and titanium nitride (TiN), metal oxides, and a transparent conductive material. For the lower electrode, for example, an Ir electrode is preferably used.

The piezoelectric film has a perovskite structure that is preferentially oriented to a (100) plane and is a composite oxide represented by a compositional formula $Pb[(Zr_xTi_{1-x})_{1-y}Nb_y]O_3$, where x satisfies 0<x<1 and y satisfies $0.10 \leq y \leq 0.13$, and $I_{(200)}/I_{(100)}$, which is a ratio between a diffraction peak intensity $I_{(100)}$ from the perovskite (100) plane and a diffraction peak intensity $I_{(200)}$ from the perovskite (200) plane as measured by an X-ray diffraction method, satisfies $0.85 \leq I_{(200)}/I_{(100)} \leq 1.00$.

Although the piezoelectric film of the present invention is represented by the compositional formula $Pb[(Zr_xTi_{1-x})_{1-y}Nb_y]O_3$, specifically, the piezoelectric film is represented by a compositional formula $Pb1+\delta[(Zr_xTi_{1-x})_{1-y}Nb_y]O_z$, where the standard composition is such that $\delta=0$ and z=3, these values may deviate from reference values in a range in which the perovskite structure can be obtained.

Herein, the preferential orientation refers to a state in which a specific crystal surface is arranged in a substantially constant direction rather than the orientation direction of crystals being disordered. Specifically, the expression "preferentially oriented to a (100) plane" means that a diffraction intensity ratio of a (100) plane, a (110) plane, and a (111) plane (100)/((100)+(110)+(111)) obtained in a case where the piezoelectric film is measured by an X-ray diffraction wide angle method is more than 0.5.

By setting the content of Nb to 0.10 (10% by percentage) or more, piezoelectric characteristics can be improved. In addition, by setting the content of Nb to 0.13 (13% by percentage) or less, the content of Pb is increased and thus an increase in a leakage current can be suppressed.

In addition, by setting the peak intensity ratio within the above range, an oxygen defect in the piezoelectric film can be suppressed and a leakage current can be suppressed.

It is more preferable that the peak intensity ratio $I_{(200)}/I_{(100)}$ satisfies $0.90 \leq I_{(200)}/I_{(100)} \leq 1.00$.

Although a mechanism by which a leakage current increases by a heat treatment is not clear, it is assumed that since the adhesion layer is formed of an easily oxidizable metal, the adhesion layer pulls out oxygen from the inside of the crystal of the piezoelectric film and is converted into an n-type semiconductor. Although the reason that a leakage current can be controlled by defining the $I_{(200)}/I_{(100)}$ ratio is not clear, it is considered that the $I_{(200)}/I_{(100)}$ ratio reflects an oxygen defect amount, lattice distortion, or the like in the crystal and is an index for indicating ease of pulling-out of oxygen.

That is, by forming the piezoelectric film, in a case where the adhesion layer is formed on the piezoelectric film and is subjected to a heat treatment, the piezoelectric film is a crystal in which oxygen ions do not easily move and thus an increase in a leakage current can be suppressed.

In addition, since the content of Nb is 10% or more and 13% or less, good piezoelectric characteristics can be maintained.

The film thickness of the piezoelectric film is preferably 2.0 μm or more. The piezoelectric film having the thick film thickness can be formed by a gas phase growth method which will be described later.

The adhesion layer 14 contains a metal having an ionization energy of 0.34 eV or less. The adhesion layer 14 improves adhesiveness between the piezoelectric film and the upper electrode. Examples of the metal having an ionization energy of 0.34 eV or less include Ti, Al, Cu, and TiW.

The upper electrode 15 is an electrode for applying a voltage to the piezoelectric film. For the upper electrode, Ir, Pt, and a combination of these elements may be used.

The thickness of the lower electrode 12 and the upper electrode 15 is not particularly limited and is preferably 50 to 500 nm.

(Method of Producing Piezoelectric Element)

A method of forming the piezoelectric film is not particularly limited and a gas phase growth method such as a sputtering method, a plasma chemical vapor deposition (CVD) method, a metal organic chemical vapor deposition (MOCVD) method, or a pulse laser deposition (PLD) method, a liquid phase method such as a sol-gel method, or an organic metal decomposition method, and an aerosol deposition method may be used. Since film formation conditions during film formation are easily changed, a gas phase growth method is preferable. In addition, by forming a film by a gas phase growth method, horizontal stripe generation during film formation can be suppressed and a piezoelectric film having high durability can be formed.

Figure 2:
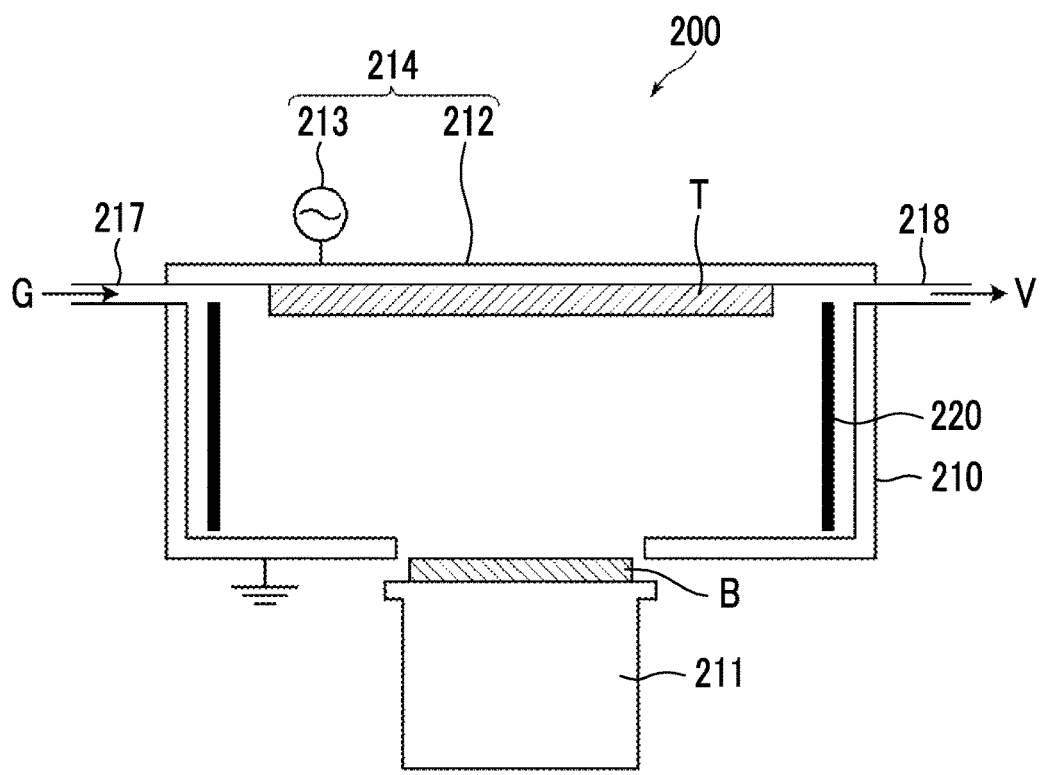
FIG. 2 is a schematic view showing an example of a configuration of a sputtering apparatus used in the preparation of the piezoelectric element of the present invention.

Next, an embodiment of a method of producing the piezoelectric element will be described with reference to FIG. 2. FIG. 2 shows a schematic view showing an example of a configuration of a sputtering apparatus.

In a sputtering apparatus (radio frequency sputtering apparatus) 200, a substrate B can be mounted. The sputtering apparatus is schematically configured to have a vacuum vessel 210 including a substrate holder 211 capable of heating the mounted substrate B to a predetermined temperature, and a target holder 212 capable of mounting a target T. In the apparatus shown in FIG. 2, the vacuum vessel 210 functions as a film formation chamber. The substrate B is a substrate on which the lower electrode is formed.

In the vacuum vessel 210, the substrate holder 211 and the target holder 212 are separately arranged to face each other. The target holder 212 is connected to a radio frequency (RF) power supply 213 arranged on the outside of the vacuum vessel 210, and the target holder 212 functions as a plasma power supply (cathode electrode) for generating plasma. In FIG. 2, as plasma generating means 214 for generating plasma in the vacuum vessel 210, the radio frequency power supply 213 and the target holder 212 which functions as a plasma electrode (cathode electrode) are provided. The composition of a target T is selected according to the composition of a film to be formed.

A film formation apparatus 200 includes gas introduction means 217 for introducing a gas G which is changed into plasma in the vacuum vessel 210, and a gas discharge means 218 which performs ventilation V of gas in the vacuum vessel 210. As the gas G, Ar, an Ar/$O_2$ mixed gas, or the like may be used.

In FIG. 2, a floating wall 220 is provided in the inside of the vacuum vessel 210 and the potential of the floating wall 220 is set at a floating potential. Since the wall surface has the same potential as a plasma potential by setting the potential of the wall surface to a floating potential, the plasma component does not easily reach the wall surface of the vacuum vessel 210 and thus the ion collision energy to the substrate B can be increased. Accordingly, Pb ions can be arranged on the A site of the perovskite structure ($ABO_3$) and the amount of unstable Pb ions in the crystal can be reduced. Thus, high piezoelectric performance can be obtained in the formed piezoelectric film.

In FIG. 2, the ion collision energy to the substrate B is increased by setting the potential of the wall surface of the vacuum vessel 210 to a floating potential. However, as another method, the ion collision energy can be controlled by reducing an anode area in the vacuum vessel 210, or by changing the impedance of the substrate B by covering the wall surface of the vacuum vessel with an insulator.

The film formation temperature is preferably 400° C. or higher and lower than 450° C. and more preferably 410° C. or higher and 440° C. or lower. The film formation temperature means the temperature of the substrate. By setting the temperature, the peak intensity ratio of the piezoelectric film can be set to $0.85 \leq I_{(200)}/I_{(100)} \leq 1.00$.

The percentage of oxygen in a film formation gas is preferably 0.5% or lower. By setting the percentage of oxygen to 0.5% or less, an excessive amount of oxygen in the film can be suppressed and thus a leakage current in the piezoelectric element after a heat treatment can be suppressed.

By sequentially laminating the adhesion layer and the upper electrode on the piezoelectric film using the sputtering apparatus, the piezoelectric element can be prepared.

EXAMPLES

The present invention will be more specifically described using examples below. The materials, additives, amounts of materials, ratios thereof, operations, and the like shown in examples below can be appropriately changed without departing from the spirit of the present invention. Accordingly, the scope of the present invention is not limited to the following examples.

Example 1

Using a sputtering apparatus on which a 300 mmφ target was mounted, as shown in FIG. 2, the potential of a film formation chamber side wall surface was set to a floating potential. A LCR (L (inductance), C (capacitance), R (resistance)) circuit having variable impedance was connected to a substrate, and the impedance of the substrate was changed. Thus, $V_{sub}$ (the potential of the substrate during film formation) during film formation could be changed. Rf sputtering was performed with an input power of 3 kW using $Pb_{1.3}(Zr_{0.46}Ti_{0.42}Nb_{0.10})O_x$ for a target to prepare a thin PZT film having a thickness of 2.0 µm (piezoelectric film). The film formation temperature was 440° C. and the film formation gas was a mixed gas of 99.5% of Ar and 0.5% of $O_2$.

Figure 3:
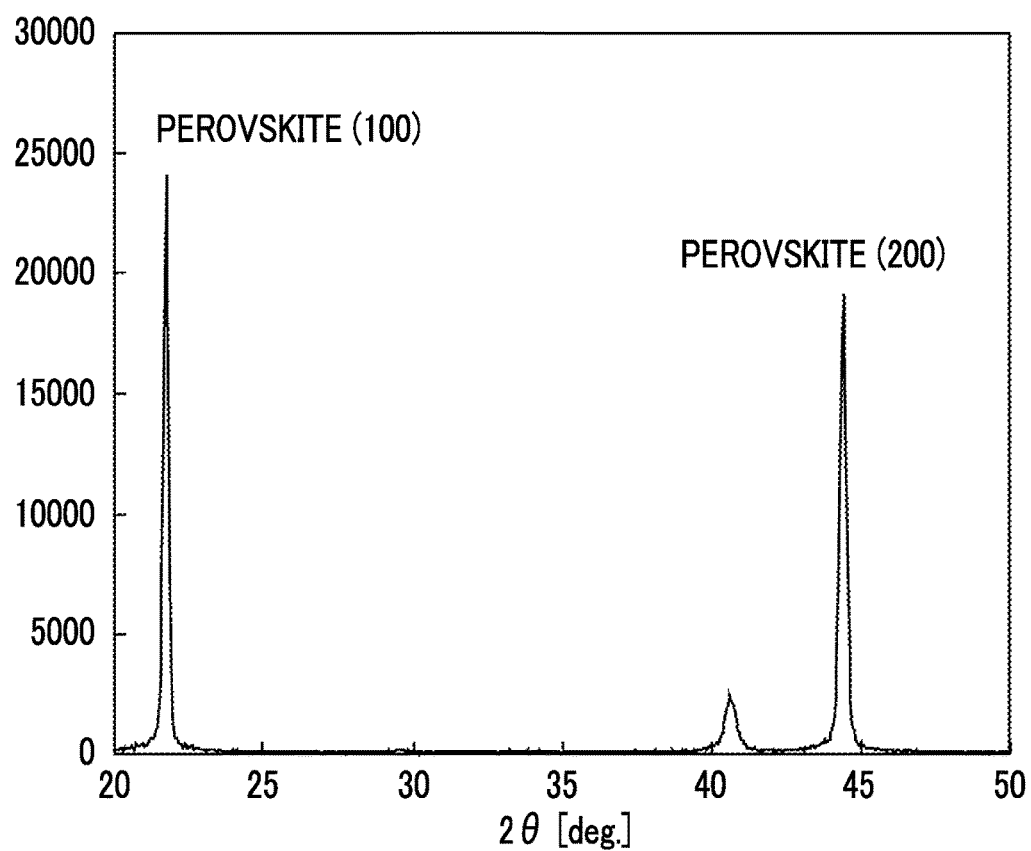
FIG. 3 is a graph showing an X-ray diffraction pattern of an example of a piezoelectric element of the present invention.

The XRD diffraction pattern of the obtained thin film is shown in FIG. 3. The piezoelectric film had a (100) single orientation and the peak intensity ratio $I_{(200)}/I_{(100)}$ was 0.85.

Next, Ti was sputtered for an adhesion layer and Pt was sputtered for an upper electrode on the substrate on which the piezoelectric film was laminated to prepare a piezoelectric element in which the upper electrode was patterned by lithography.

The obtained piezoelectric element was subjected to a heat treatment at 350° C. for 5 minutes. Before and after the heat treatment, the current density at an electric field intensity of 250 KV/cm was measured.

Example 2

A thin PZT film was prepared under the same conditions as in Example 1 except that a PZT in which 11% of Nb was doped on the B site was used as a target. The addition of Nb was adjusted such that the ratio of Zr:Ti became 46:42. In the following Examples and Comparative Examples, regardless of the amount of Nb doped, the compositional ratio between zirconium and titanium was fixed to Zr:Ti=46:42.

As a result of measuring the XRD diffraction pattern of the obtained thin film, the piezoelectric film had a (100) single orientation and the peak intensity ratio $I_{(200)}/I_{(100)}$ was 0.85.

Example 3

A thin PZT film was prepared under the same conditions as in Example 1 except that a PZT in which 12% of Nb was doped on the B site was used as a target. As a result of measuring the XRD diffraction pattern of the obtained thin film, the piezoelectric film had a (100) single orientation and the peak intensity ratio $I_{(200)}/I_{(100)}$ was 0.85.

Example 4

A thin PZT film was prepared under the same conditions as in Example 1 except that a PZT in which 13% of Nb was doped on the B site was used as a target. As a result of measuring the XRD diffraction pattern of the obtained thin film, the piezoelectric film had a (100) single orientation and the peak intensity ratio $I_{(200)}/I_{(100)}$ was 0.85.

Example 5

A thin PZT film was prepared under the conditions that a PZT in which 10% of Nb was doped on the B site was used as a target, the film formation temperature was set to 430° C., and a mixed gas of 99.5% of Ar and 0.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 0.90.

Example 6

A thin PZT film was prepared under the conditions that a PZT in which 12% of Nb was doped on the B site was used as a target, the film formation temperature was set to 430°

C., and a mixed gas of 99.5% of Ar and 0.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 0.90.

Example 7

A thin PZT film was prepared under the conditions that a PZT in which 13% of Nb was doped on the B site was used as a target, the film formation temperature was set to 430° C., and a mixed gas of 99.5% of Ar and 0.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 0.90.

Example 8

A thin PZT film was prepared under the conditions that a PZT in which 12% of Nb was doped on the B site was used as a target, the film formation temperature was set to 420° C., and a mixed gas of 99.5% of Ar and 0.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 0.95.

Example 9

A thin PZT film was prepared under the conditions that a PZT in which 12% of Nb was doped on the B site was used as a target, the film formation temperature was set to 410° C., and a mixed gas of 99.5% of Ar and 0.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 1.00.

Comparative Example 1

A thin PZT film was prepared under the same conditions as in Example 1 except that a PZT in which 16% of Nb was doped on the B site was used as a target. As a result of measuring the XRD diffraction pattern of the obtained thin film, the piezoelectric film had a (100) single orientation and the peak intensity ratio $I_{(200)}/I_{(100)}$ was 0.85.

Comparative Example 2

A thin PZT film was prepared under the conditions that a PZT in which 10% of Nb was doped on the B site was used as a target, the film formation temperature was set to 450° C., and a mixed gas of 98.5% of Ar and 1.5% of $O_2$ was set as a film formation gas. As a result of measuring the XRD diffraction pattern of the obtained thin film, the piezoelectric film had a (100) single orientation and the peak intensity ratio $I_{(200)}/I_{(100)}$ was 0.80.

Comparative Example 3

A thin PZT film was prepared under the conditions that a PZT in which 13% of Nb was doped on the B site was used as a target, the film formation temperature was set to 450° C., and a mixed gas of 98.5% of Ar and 1.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 0.80.

Comparative Example 4

A thin PZT film was prepared under the conditions that a PZT in which 15% of Nb was doped on the B site was used as a target, the film formation temperature was set to 450° C., and a mixed gas of 98.5% of Ar and 1.5% of $O_2$ was used as a film formation gas. As a result of conducting XRD diffraction measurement of the obtained thin film, the piezoelectric film had a (100) single orientation and the peak intensity ratio $I_{(200)}/I_{(100)}$ was 0.80.

Comparative Example 5

A thin PZT film was prepared under the conditions that a PZT in which 13% of Nb was doped on the B site was used as a target, the film formation temperature was set to 470° C., and a mixed gas of 98.5% of Ar and 1.5% of $O_2$ was used as a film formation gas. An XRD diffraction pattern of the obtained thin film is shown. As a result of conducting XRD diffraction measurement of the obtained thin film, the piezoelectric film had a (100) single orientation and the peak intensity ratio $I_{(200)}/I_{(100)}$ was 0.70.

Comparative Example 6

A thin PZT film was prepared under the conditions that a PZT in which 14% of Nb was doped on the B site was as a target, the film formation temperature was set to 440° C., and a mixed gas of 98.5% of Ar and 1.5% of $O_2$ was used as a film formation gas. As a result of conducting XRD diffraction measurement of the obtained thin film, the piezoelectric film had a (100) single orientation and the peak intensity ratio $I_{(200)}/I_{(100)}$ was 0.85.

Comparative Example 7

A thin PZT film was prepared under the conditions that a PZT in which 15% of Nb was doped on the B site was used as a target, the film formation temperature was set to 440° C., and a mixed gas of 98.5% of Ar and 1.5% of $O_2$ was used as a film formation gas. An XRD diffraction pattern of the obtained thin film is shown. The piezoelectric film had a (100) single orientation and the peak intensity ratio $I_{(200)}/I_{(100)}$ was 0.85.

Comparative Example 8

A thin PZT film was prepared under the conditions that a PZT in which 12% of Nb was doped on the B site was used as a target, the film formation temperature was set to 400° C., and a mixed gas of 98.5% of Ar and 1.5% of $O_2$ was used as a film formation gas. As a result of measuring the XRD diffraction pattern of the obtained thin film, the piezoelectric film had a (100) single orientation and the peak intensity ratio $I_{(200)}/I_{(100)}$ was 1.10.

The measurement results of the leakage current density before and after the heat treatment of Examples and Comparative examples are shown in Table 1.

TABLE 1

| | Content of Nb (%) | $I_{(200)}/I_{(100)}$ | Leakage current density before heat treatment [A/cm²] | Leakage current density after heat treatment [A/cm²] | Increase in leakage current density before and after heat treatment [A/cm²] | Evaluation |
|---|---|---|---|---|---|---|
| Example 1 | 10 | 0.85 | $9.0 \times 10^{-8}$ | $1.3 \times 10^{-7}$ | $4.0 \times 10^{-8}$ | B |
| Example 2 | 11 | 0.85 | $6.8 \times 10^{-8}$ | $1.1 \times 10^{-7}$ | $4.6 \times 10^{-8}$ | B |
| Example 3 | 12 | 0.85 | $6.2 \times 10^{-8}$ | $9.7 \times 10^{-8}$ | $3.5 \times 10^{-8}$ | B |
| Example 4 | 13 | 0.85 | $5.8 \times 10^{-8}$ | $9.9 \times 10^{-8}$ | $4.1 \times 10^{-8}$ | B |
| Example 5 | 10 | 0.90 | $6.4 \times 10^{-8}$ | $7.7 \times 10^{-8}$ | $1.3 \times 10^{-8}$ | A |
| Example 6 | 12 | 0.90 | $6.0 \times 10^{-8}$ | $7.2 \times 10^{-8}$ | $1.2 \times 10^{-8}$ | A |
| Example 7 | 13 | 0.90 | $6.1 \times 10^{-8}$ | $7.6 \times 10^{-8}$ | $1.4 \times 10^{-8}$ | A |
| Example 8 | 12 | 0.95 | $7.2 \times 10^{-8}$ | $9.0 \times 10^{-8}$ | $1.8 \times 10^{-8}$ | B |
| Example 9 | 12 | 1.00 | $6.9 \times 10^{-8}$ | $9.1 \times 10^{-8}$ | $2.3 \times 10^{-8}$ | B |
| Comparative Example 1 | 16 | 0.85 | $6.5 \times 10^{-8}$ | $3.1 \times 10^{-6}$ | $3.1 \times 10^{-6}$ | C |
| Comparative Example 2 | 10 | 0.80 | $5.5 \times 10^{-8}$ | $4.8 \times 10^{-5}$ | $4.8 \times 10^{-5}$ | C |
| Comparative Example 3 | 13 | 0.80 | $6.5 \times 10^{-8}$ | $5.0 \times 10^{-5}$ | $5.0 \times 10^{-5}$ | C |
| Comparative Example 4 | 15 | 0.80 | $5.4 \times 10^{-8}$ | $4.6 \times 10^{-5}$ | $4.6 \times 10^{-5}$ | C |
| Comparative Example 5 | 13 | 0.70 | $5.3 \times 10^{-8}$ | $4.5 \times 10^{-4}$ | $4.5 \times 10^{-4}$ | C |
| Comparative Example 6 | 14 | 0.85 | $6.3 \times 10^{-8}$ | $4.1 \times 10^{-6}$ | $4.1 \times 10^{-6}$ | C |
| Comparative Example 7 | 15 | 0.85 | $6.4 \times 10^{-8}$ | $6.1 \times 10^{-6}$ | $6.1 \times 10^{-6}$ | C |
| Comparative Example 8 | 12 | 1.10 | $6.6 \times 10^{-8}$ | $6.1 \times 10^{-7}$ | $5.5 \times 10^{-7}$ | C |

An increase in leakage current density before and after the heat treatment was evaluated based on the following evaluation standards.

<Evaluation Standards>

A: An increase in leakage current density by the heat treatment was less than $1.5 \times 10^{-8}$.

B: An increase in leakage current density by the heat treatment was $1.5 \times 10^{-8}$ or more.

C: An increase in leakage current density by the heat treatment was $5.5 \times 10^{-7}$ or more.

From Examples shown in Table 1, it was found that in a case where the content of Nb was 10% or more and 13% or less and the peak intensity ratio $I_{(200)}/I_{(100)}$ was 0.85 or more and 1.00 or less, an increase in the leakage current before and after the heat treatment could be suppressed. It was confirmed that the piezoelectric element of each of Examples had a good piezoelectric constant.

On the other hand, in Comparative Examples in which either or both of the content of Nb and the peak intensity ratio $I_{(200)}/I_{(100)}$ were out of the range of the present invention, it was found that the leakage current was increased by the heat treatment. Particularly, in Comparative Examples 1, 6, and 7 in which the peak intensity ratio $I_{(200)}/I_{(100)}$ was 0.85 or more and 1.00 or less but the content of Nb was more than 13%, it was considered that the leakage current was increased because the amount of unstable Pb ions in the crystal was increased.

The piezoelectric film of the present invention can be preferably used for an ink jet recording head, a magnetic recording and reproducing head, a micro electro-mechanical systems (MEMS) device, a micropump, a piezoelectric actuator mounted in an ultrasound probe, and a ferroelectric element such as a ferroelectric memory.

What is claimed is:

1. A piezoelectric element comprising:
   a substrate;
   a lower electrode;
   a piezoelectric film;
   an adhesion layer; and
   an upper electrode,
   wherein the lower electrode, the piezoelectric film, the adhesion layer, and the upper electrode are provided on the substrate in this order,
   the piezoelectric film has a perovskite structure that is preferentially oriented to a (100) plane and is a composite oxide represented by a compositional formula $Pb[(Zr_xTi_{1-x})_{1-y}Nb_y]O_3$, where x satisfies $0<x<1$ and y satisfies $0.10 \le y < 0.13$,
   $I_{(200)}/I_{(100)}$, which is a ratio between a diffraction peak intensity $I_{(100)}$ from the perovskite (100) plane and a diffraction peak intensity $I_{(200)}$ from a perovskite (200) plane as measured by X-ray diffraction method, satisfies $0.85 \le I_{(200)}/I_{(100)} \le 1.00$, and
   the adhesion layer contains a metal having an ionization energy of 0.34 eV or less.

2. The piezoelectric element according to claim 1, wherein $I_{(200)}/I_{(100)}$ satisfies $0.90 \le I_{(200)}/I_{(100)} \le 1.00$.

3. The piezoelectric element according to claim 1, wherein a film thickness of the piezoelectric film is 2.0 μm or more.

* * * * *